(12) United States Patent
Kagami et al.

(10) Patent No.: US 6,992,870 B2
(45) Date of Patent: Jan. 31, 2006

(54) MAGNETO-RESISTIVE DEVICE, AND MAGNETIC HEAD AND HEAD SUSPENSION ASSEMBLY USING SAME

(75) Inventors: Takeo Kagami, Tokyo (JP); Kazuki Sato, Tokyo (JP); Shunji Saruki, Tokyo (JP); Takumi Uesugi, Tokyo (JP)

(73) Assignee: TDK Corporation, Tokyo (JP)

( * ) Notice: Subject to any disclaimer, the term of this patent is extended or adjusted under 35 U.S.C. 154(b) by 298 days.

(21) Appl. No.: 10/215,022

(22) Filed: Aug. 9, 2002

(65) Prior Publication Data

US 2003/0086216 A1 May 8, 2003

(30) Foreign Application Priority Data

Oct. 25, 2001 (JP) .............................. 2001-327487

(51) Int. Cl.
*G11B 5/127* (2006.01)
(52) U.S. Cl. .................................................. 360/324.2
(58) Field of Classification Search ............. 360/324.2, 360/324.11, 324.12
See application file for complete search history.

(56) References Cited

U.S. PATENT DOCUMENTS

| 5,898,547 | A | 4/1999 | Fontana, Jr. et al. | |
|---|---|---|---|---|
| 5,901,018 | A | 5/1999 | Fontana, Jr. et al. | |
| 5,991,125 | A * | 11/1999 | Iwasaki et al. | 360/324.12 |
| 6,005,753 | A | 12/1999 | Fontana, Jr. et al. | |
| 6,052,263 | A | 4/2000 | Gill | |
| 6,157,525 | A * | 12/2000 | Iwasaki et al. | 360/324.12 |
| 6,219,212 | B1 | 4/2001 | Gill et al. | |
| 6,266,218 | B1 * | 7/2001 | Carey et al. | 360/324.12 |
| 6,563,682 | B1 * | 5/2003 | Sugawara et al. | 360/324.2 |
| 6,678,128 | B2 * | 1/2004 | Saito et al. | 360/324.11 |
| 6,731,479 | B2 * | 5/2004 | Ooshima et al. | 360/324.12 |

FOREIGN PATENT DOCUMENTS

| JP | A 07-066033 | 3/1995 |
|---|---|---|
| JP | A 2000-132814 | 5/2000 |
| JP | A 2000-228003 | 8/2000 |
| JP | A 2001-068757 | 3/2001 |
| JP | A 2001-084521 | 3/2001 |
| JP | A 2001-223412 | 8/2001 |
| JP | A 2001-283412 | 10/2001 |
| JP | A 2002-157711 | 5/2002 |
| JP | A 2003-060263 | 2/2003 |
| JP | A 2003-124542 | 4/2003 |

* cited by examiner

*Primary Examiner*—Allen Cao
(74) *Attorney, Agent, or Firm*—Oliff & Berridge PLC

(57) ABSTRACT

An upper metal layer made of a non-magnetic metal is formed as a protection layer on the top surface of a free layer positioned topmost of a magneto-resistive layer constituting a TMR device. An upper electrode, serving additionally as an upper magnetic shield layer, is electrically connected to the free layer through an underlying layer of the upper electrode, and the upper metal layer. The thickness of the upper metal layer is chosen to be 10 nm or more.

18 Claims, 8 Drawing Sheets

MAGNETO-RESISTIVE DEVICE, AND MAGNETIC HEAD AND HEAD SUSPENSION ASSEMBLY USING SAME

BACKGROUND OF THE INVENTION

The present invention relates to a magneto-resistive device, and a magnetic head and a head suspension assembly using the same.

With the trend to a larger capacity and a smaller size of hard disk drives (HDD), heads are required to have a higher sensitivity and larger output. To meet this requirement, strenuous efforts have been made to improve characteristics of GMR head (Giant Magneto-Resistive Head) currently available on the market. On the other hand, intense development is under way for a tunnel magneto-resistive head (TMR head) which can be expected to have a resistance changing ratio twice or more higher than the GMR head.

Generally, the GMR head differs from the TMR head in the head structure due to a difference in a direction in which a sense current is fed. A head structure adapted to feed a sense current in parallel with a film plane, as in a general GMR head, is referred to as a CIP (Current In Plane) structure, while a head structure adapted to feed a sense current perpendicularly to a film plane, as in the TMR head, is referred to as a CPP (Current Perpendicular to Plane) structure. Since the CPP structure can use a magnetic shield itself as an electrode, it is essentially free from short-circuiting between the magnetic shield and a device (defective insulation) which is a serious problem in reducing a lead gap in the CIP structure. For this reason, the CPP structure is significantly advantageous in providing a higher recording density.

Other than the TMR head, also known as a head in CPP structure is, for example, a CPP-GMR head which has the CCP structure, though a spin valve film (including a specular type multilayer film and a dual spin valve type magnetic multilayer film) is used for a magneto-resistive device.

Any type of CPP-based head has an upper electrode and a lower electrode for supplying a current to a magneto-resistive layer formed on a base, formed on the top (opposite to the base) and on the bottom (close to the base) of the magneto-resistive layer, respectively. Generally, for reasons of manufacturing process, the base formed with the magneto-resistive layer is left in the atmosphere after the magneto-resistive layer is formed and before the upper electrode is formed. In this event, for preventing the top surface of the magneto-resistive layer from being oxidized in the air to damage the characteristics of the magneto-resistive layer such as an MR ratio, a non-magnetic metal layer, called a "cap layer," is previously formed as a protection film on the top surface of the magneto-resistive layer. Ta or the like is used for the non-magnetic metal layer. Then, in the CPP-based head, the upper electrode is electrically connected to the magneto-resistive layer through the non-magnetic metal layer.

In the CCP-based head, the magneto-resistive layer is supplied with a current through the upper electrode and non-magnetic metal layer, so that a good electrical contact must be maintained between the upper electrode and non-magnetic metal layer to reduce the resistance. However, since Ta or the like is used for the non-magnetic metal layer, the surface of the non-magnetic metal layer is oxidized in the air while the base formed with the magneto-resistive layer and non-magnetic metal layer is left in the atmosphere. Thus, if another layer such as an upper electrode is formed on the oxidized non-magnetic metal layer, a good electrical contact cannot be maintained between the upper electrode and non-magnetic metal layer. To solve this inconvenience, the surface oxide film is removed from the non-magnetic metal layer by dry etching (including a whole dry process such as sputter etching, ion beam etching, and the like) within the same vacuum chamber in which the upper electrode and the like are deposited, prior to the formation of another layer such as the upper electrode on the non-magnetic metal layer.

It is a conventional technical common sense that the thickness of the non-magnetic metal layer should be reduced as much as possible to such an extent that the oxidation on the surface of the magneto-resistive layer can be effectively prevented in the air, so that the thickness of the non-magnetic metal layer has been set to as thin as approximately 5 nm. This is because it is believed that a thinner non-magnetic metal layer results in a better end face shape of a magneto-resistive layer, which is determined when the magneto-resistive layer is milled into a desired shape, to improve the characteristics of the magneto-resistive device.

However, the result of a research made by the inventors revealed that the foregoing technical common sense is not always correct. Specifically, factors conventionally taken into consideration are the prevention of oxidized surface of the magneto-resistive layer, and the end face shape of the magneto-resistive layer, while overlooking a damage to the magneto-resistive layer by an ion beam in a process of removing a surface oxide film from the non-magnetic metal layer. For example, it has been revealed that, in a TMR head, when a tunnel barrier layer is extremely reduced in thickness (for example, to 1 nm or less) in order to reduce the resistance of a magneto-resistive layer itself, the tunnel barrier layer is largely damaged by the ion beam in the process of removing a surface oxide film from a non-magnetic metal layer, resulting in an extremely reduced MR ratio and an occasional failure in utilization as a magnetic head. While such a damage caused by the ion beam is particularly large in the TMR head, the same is true in other CPP-based heads such as a CPP-GMR head.

SUMMARY OF THE INVENTION

It is an object of the present invention to provide a magneto-resistive device which is capable of ensuring a good electrical contact between an electrode and a non-magnetic metal layer, while preventing oxidization of the surface of a magneto-resistive layer by using the non-magnetic metal layer, and reducing a damage to the magneto-resistive layer by an ion beam to consequently improve the characteristics of the device, and a magnetic head and a head suspension assembly using the same.

A magneto-resistive device according to a first aspect of the present invention comprises a magneto-resistive layer formed on one surface side of a base, and a non-magnetic metal layer having one or more layers formed on the magneto-resistive layer on the side opposite to the base, wherein the non-magnetic metal layer has a thickness of 10 nm or more.

According to the first aspect, since the non-magnetic metal layer is formed on the magneto-resistive layer on the side opposite to the base, the non-magnetic metal layer can prevent the surface of the magneto-resistive layer from oxidization, as is the case with the conventional magnetic head described above.

In addition, even if the surface of the non-magnetic metal layer is oxidized in the air, the surface oxide film on the non-magnetic metal layer is removed by dry etching before another layer such as an electrode is formed on the non-magnetic metal layer, so that a good electric contact can be established between the electrode and the non-magnetic metal layer. In this event, the magneto-resistive layer is damaged by an ion beam in the dry etching. However, in the magneto-resistive device according to the first aspect, since the thickness of the non-magnetic metal layer is 10 nm or more which is larger than the aforementioned thickness in the prior art, the magneto-resistive layer is less damaged than that in the prior art. Thus, the device according to the first aspect exhibits better characteristics, as compared with the prior art.

As described above, in the first aspect, in view of the damage to the magneto-resistive layer by an ion beam, which has been so far overlooked, the non-magnetic metal layer is made thicker, contrary to the conventional technical common sense that the non-magnetic metal layer should be made as thin as possible, to reduce the damage to the magneto-resistive layer by the ion beam and consequently improve the characteristics of the device. While the non-magnetic metal layer thicker than before results in a more or less worse end face shape of at least the topmost layer in the magneto-resistive layer which is determined when the layer is milled, the improvement in the characteristics of the device resulting from the reduction in the damage by the ion beam is more significant than a degradation in the characteristics of the device resulting from the worse end face shape of the layer, so that the characteristics of the device can be consequently improved from a comprehensive viewpoint.

For further reducing the damage to the magneto-resistive layer by an ion beam, the thickness of the non-magnetic metal layer is preferably 12 nm or more, more preferably 13.5 nm or more, further preferably 15 nm or more. However, the non-magnetic metal layer having an excessively large thickness is not preferable because it would result in a larger resistance of the non-magnetic metal layer and a larger MR gap to cause difficulties in increasing the recording density. Therefore, the thickness of the non-magnetic metal layer is preferably 30 nm or less, more preferably 25 nm or less, and further preferably 20 nm or less.

In the magneto-resistive device according to a second aspect of the present invention, the magneto-resistive layer includes a tunnel barrier layer; a free layer formed on one surface side of the tunnel barrier layer; a pinned layer formed on other surface side of the tunnel barrier layer; and a pin layer formed on one surface side of the pinned layer, the one surface facing to the tunnel barrier layer in the first aspect.

The second aspect shows an example in which the first aspect is applied to a TMR device. In the TMR device, as the tunnel barrier layer is made extremely thin in order to reduce the resistance of the magneto-resistive layer itself, the influence of the damage by an ion beam is significant. Therefore, when the first aspect is applied to a TMR device as shown in the second aspect, resulting effects are remarkable.

In the magneto-resistive device according to a third aspect of the present invention, the non-magnetic metal layer is formed such that the non-magnetic metal layer substantially exactly overlaps at least the layer in the magneto-resistive layer furthest away from the base in the first or second aspect.

According to the third aspect, when at least the layer in the magneto-resistive layer furthest away from the base is milled into a desired shape, a conductive protection layer can be simultaneously milled, thereby achieving so-called self-alignment. This is preferable because the manufacturing process is simplified.

The magneto-resistive device according to a fourth aspect of the present invention, further comprises, in any of the first to third aspects, a pair of electrodes for supplying the magneto-resistive layer with a current, wherein at least one of the pair of electrodes is electrically connected to the magneto-resistive layer through the non-magnetic metal layer. The fourth aspect gives an exemplary arrangement of the electrodes.

In the magneto-resistive device according to a fifth aspect of the present invention, the non-magnetic metal layer includes one or more of materials selected from a group consisting of tantalum, rhodium, ruthenium, osmium, tungsten, palladium, platinum, gold, and alloys including one or more of the elements in any of the first to fourth aspect.

While the fifth aspect enumerates specific examples of materials suitable for use as the conductive protection layer, such materials are not limited to these examples in the first to fourth aspects.

A magnetic head according to a sixth aspect of the present invention comprises a base, and a magneto-resistive device supported by the base, wherein the magneto-resistive device is a magneto-resistive device according to any of the first to fifth aspects.

Since the magnetic head according to the sixth aspect employs the magneto-resistive device in any of the first to fifth aspects, the magnetic head can ensure a good electric contact between the electrode and non-magnetic metal layer, while preventing the oxidization on the surface of the magneto-resistive layer by using the non-magnetic metal layer, and reducing a damage to the magneto-resistive layer by an ion beam to consequently improve the characteristics of the device.

A head suspension assembly according to a seventh aspect of the present invention comprises a magnetic head, and a suspension for supporting the magnetic head mounted near a leading end thereof, wherein the magnetic head is the magnetic head according to the sixth aspect.

According to the seventh aspect, since the head suspension assembly employs the magnetic head according to the sixth aspect, it is possible to increase the recording density of a magnetic disk drive and the like.

DESCRIPTION OF THE PREFERRED EMBODIMENTS

In the following, a magneto-resistive device, and a magnetic head and a head suspension assembly using the same, according to the present invention will be described with reference to the accompanying drawings.

First, a magnetic head according to a first embodiment of the present invention will be described with reference to FIGS. 1 to 5.

Figure 1:
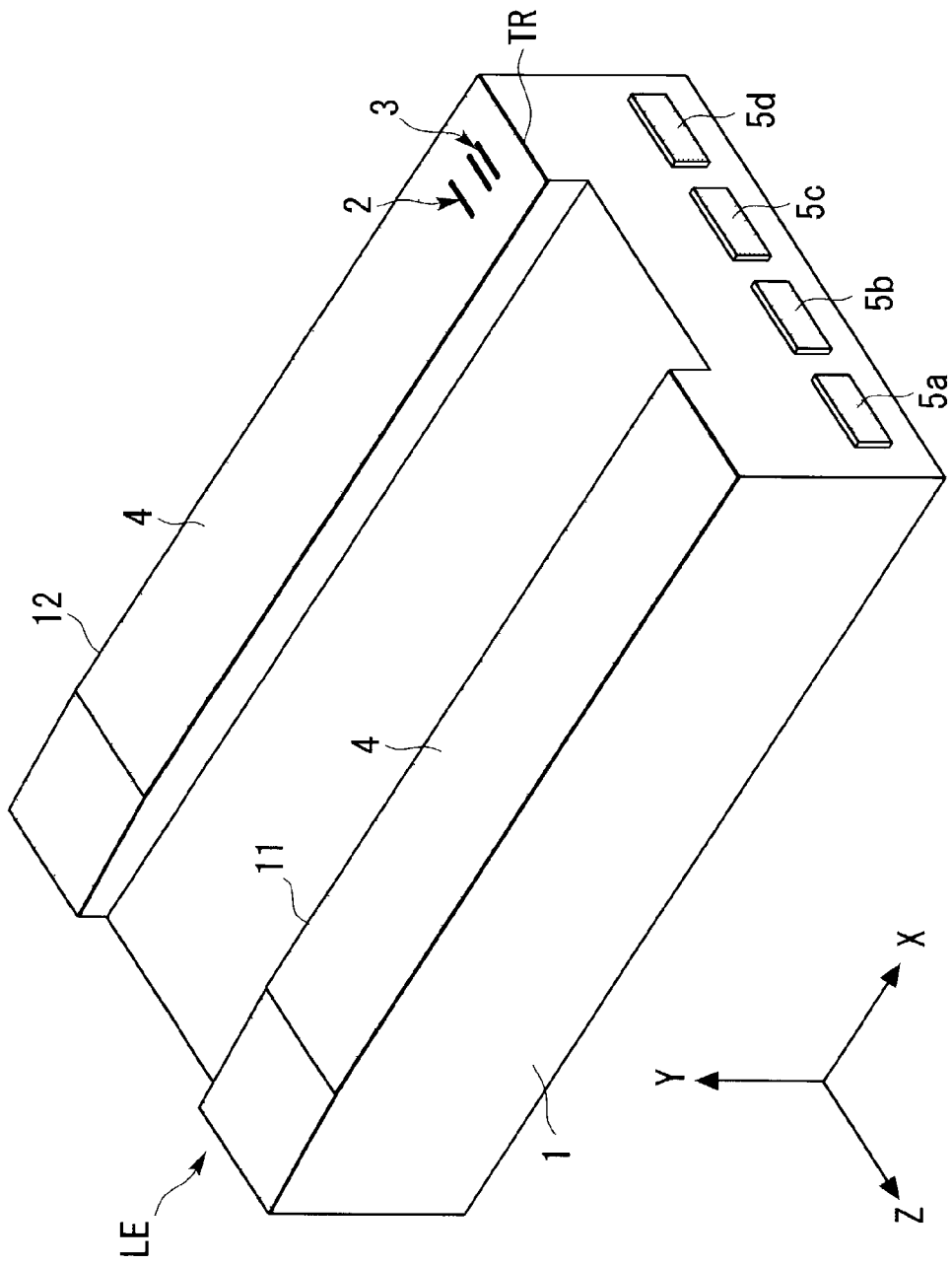
FIG. 1 is a general perspective view schematically illustrating a magnetic head according to a first embodiment of the present invention.
Figure 2:
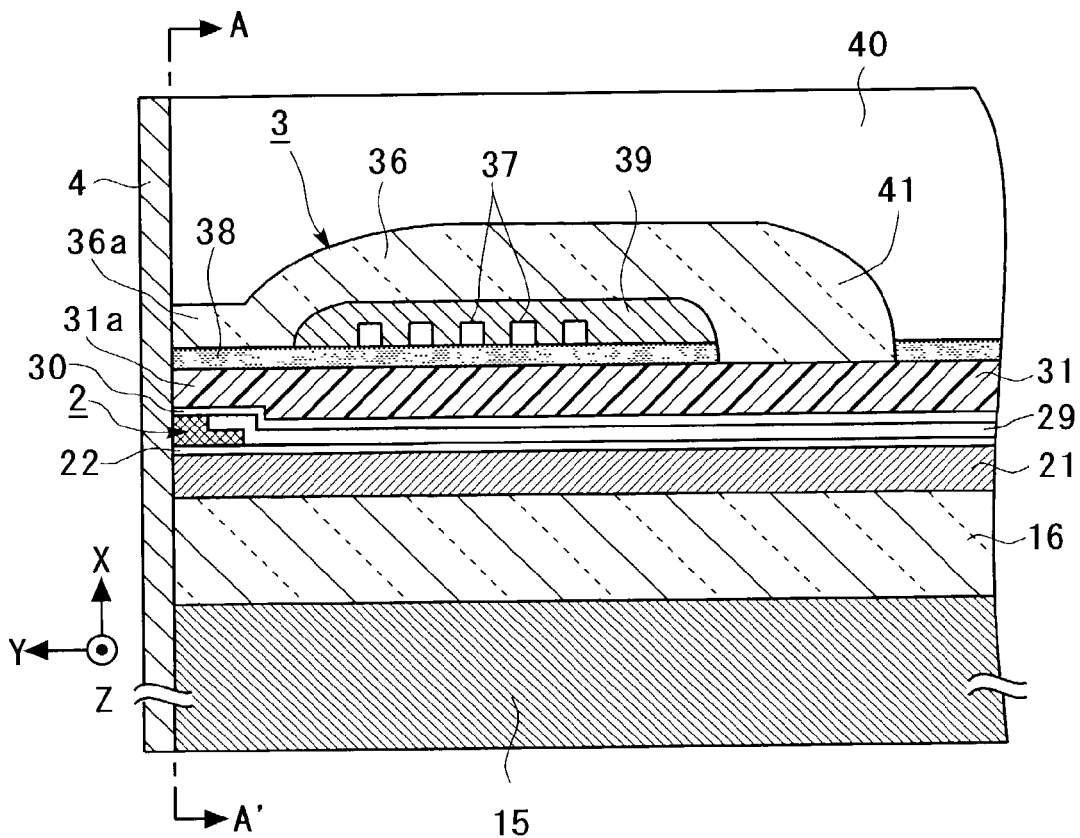
FIG. 2 is an enlarged cross-sectional view schematically illustrating a portion of a TMR device and an inductive magnetic transducing device in the magnetic head illustrated in FIG. 1.
Figure 3:
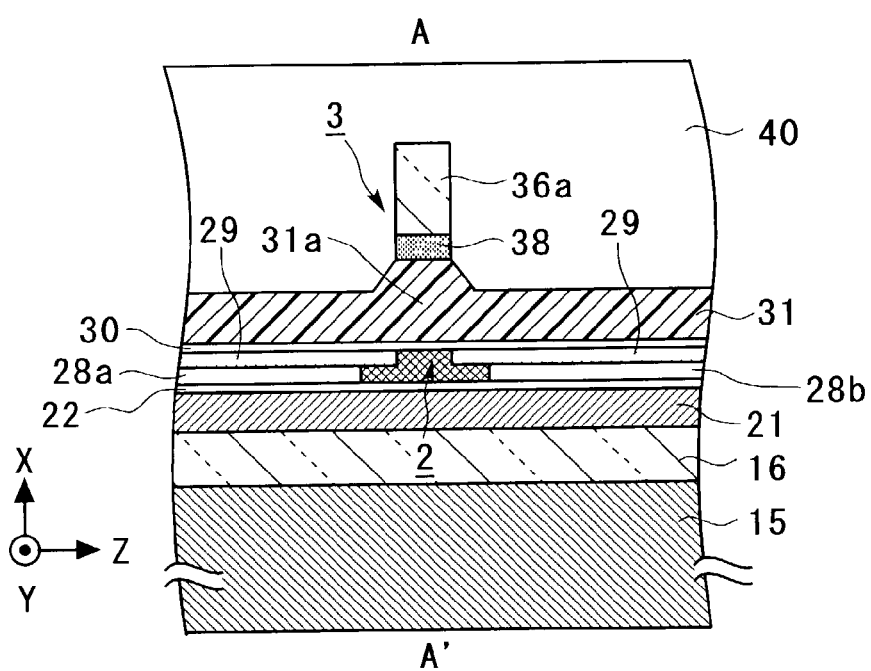
FIG. 3 is a general sectional view taken along a line A–A' indicated by arrows in FIG. 2.
Figure 4:
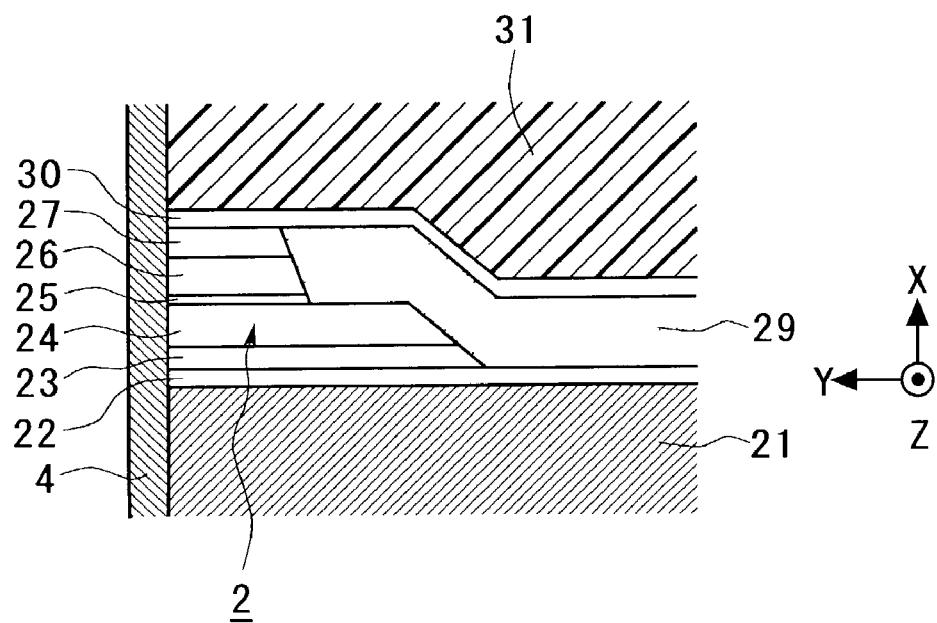
FIG. 4 is a further enlarged view around the TMR device in FIG. 2.
Figure 5:
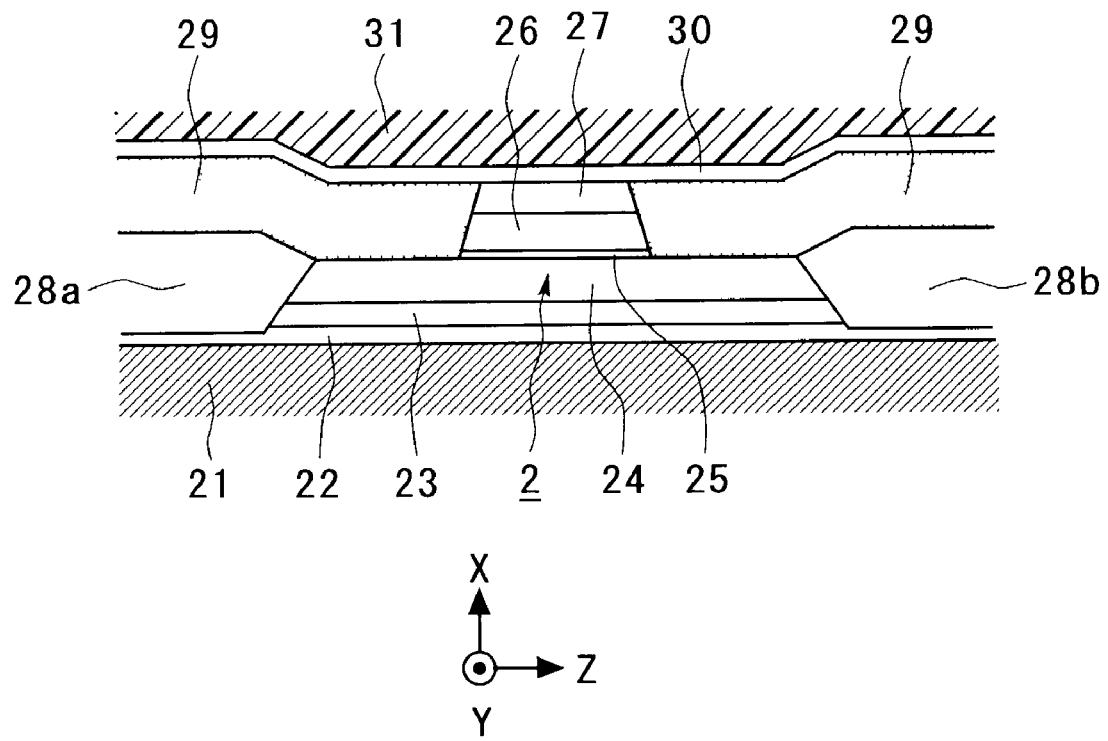
FIG. 5 is a further enlarged view around the TMR device in FIG. 3.

FIG. 1 is a general perspective view schematically illustrating the magnetic head according to the first embodiment of the present invention. FIG. 2 is an enlarged cross-sectional view schematically illustrating a portion of a TMR device 2 and an inductive magnetic transducing device 3 in the magnetic head illustrated in FIG. 1. FIG. 3 is a general sectional view taken along a line A–A' indicated by arrows in FIG. 2. FIG. 4 is a further enlarged view illustrating around the TMR device 2 in FIG. 2. FIG. 5 is a further enlarged view around the TMR device 2 in FIG. 3. For facilitating the understanding, an X-axis, a Y-axis and a Z-axis, orthogonal to one another, are defined as shown in FIGS. 1 to 5 (the same applies to figures later described). The X-axis direction is the same as a direction in which a magnetic recording medium is moved.

As illustrated in FIG. 1, the magnetic head according to the first embodiment comprises a slider 1 as a base; the TMR device 2 as a magneto-resistive device for use as a magnetic head device for reproduction; an inductive magnetic transducing device 3 as a magnetic head device for recording; and a protection film 4 made of a DLC film or the like, and is configured as a composite magnetic head. However, the magnetic head according to the present invention may comprise only the TMR device 2. Also, while the magnetic head of the first embodiment comprises one each of the devices 2, 3, the numbers of these devices are not limited in any sense.

The slider 1 has rails 11, 12 on a surface opposite to a magnetic recording medium, and the surfaces of the rails 11, 12 define air bearing surfaces (ABS). In the example illustrated in FIG. 1, there are two rails 11, 12, but the number of rails is not limited to two. For example, the slider 1 may have one to three rails, or the ABS may be a flat surface without rails. In addition, the ABS may be formed with a variety of geometric shapes for improving a floating characteristic and the like. The magnetic head according to the present invention may have any type of slider.

In the first embodiment, the protection film 4 is applied only on the surfaces of the rails 11, 12, so that the surface of the protection film 4 defines the ABS. Actually, the protection film 4 may be applied on the entire surface of the slider 1 opposite to a magnetic recording medium. While the protection film 4 is preferably provided, the protection film 4 may not be necessarily provided.

The TMR device 2 and inductive magnetic transducing device 3 are disposed on the rail 12 near an air outlet end TR, as illustrated in FIG. 1. A direction in which a recording medium is moved is identical to the X-axis direction in FIG. 1, and also identical to a direction in which air flows when the magnetic recording medium is rapidly moved. Air enters from an air inlet end LE and exits from the air outlet end TR. The slider 1 is provided on an end face of the air outlet end TR with bonding pads 5a, 5b connected to the TMR device 2, and bonding pads 5c, 5d connected to the inductive magnetic transducing device 3.

As illustrated in FIGS. 2 and 3, the TMR device 2 and inductive magnetic transducing device 3 are laminated on an underlying layer 16 deposited on a ceramic base 15 which constitutes the slider 1. The ceramic base 15 is generally made of AlTic ($Al_2O_3$-Tic), SiC or the like. When $Al_2O_3$-Tic is used, an insulating film made, for example, of $Al_2O_3$ is used for the underlying layer 16 since $Al_2O_3$-Tic is electrically conductive. The underlying layer 16 may not be provided in some cases.

As illustrated in FIG. 4 and 5, the TMR device 2 comprises a lower electrode 21 formed on the underlying layer 16; an upper electrode 31 formed overlying the lower electrode 21 (opposite to the base 15); and a lower metal layer 22, a pin layer 23, a pinned layer 24, a tunnel barrier layer 25, a free layer 26, and an upper metal layer (cap layer) 27 as a non-magnetic metal layer which serves as a protection layer, and an underlying layer 30 of the upper electrode 31 laminated in this order from the lower electrode 21 between the electrodes 21, 31. The pin layer 23, pinned layer 24, tunnel barrier layer 25 and free layer 26 constitute a magneto-resistive layer. While the actual TMR device 2 typically has a laminate structure compose of a larger number of layers, rather than the laminate structure composed of the number of layers as illustrated, the illustrated magnetic head represents a laminate structure minimally required for the basic operation of the TMR device 2 for simplifying the description.

In the first embodiment, the lower electrode 21 and upper electrode 31 are additionally used as a lower magnetic shield and an upper magnetic shield, respectively. The electrodes 21, 31 are formed of a magnetic material, for example, NiFe or the like. Though not shown, these electrodes 21, 31 are electrically connected to the aforementioned bonding pads 5a, 5b, respectively. It should be understood that a lower magnetic shield and an upper magnetic shield may be provided in addition to the lower electrode 21 and upper electrode 31.

The lower metal layer 22 is an electrically conductive material which is comprised, for example, of a laminate including a Ta layer and an NiFe layer laminated in this order from the base 15. The pinned layer 24 and free layer 26 are comprised of ferromagnetic layer formed of such a material as Fe, Co, Ni, FeCo, NiFe, CoZrNb, FeCoNi, or the like. The pin layer 23, which is comprised of a antiferromagnetic layer, is preferably formed, for example, of an Mn-based alloy such as PtMn, IrMn, RuRhMn, FeMn, NiMn, PdPtMn, RhMn, CrMnPt, or the like. The pinned layer 24 has its magnetization direction fixed in a predetermined direction by an exchange bias magnetic field between the pinned layer 24 and the pin layer 23. On the other hand, the free layer 26 freely varies its magnetization direction in response to an external magnetic field which is basically magnetic information. In this embodiment, the pin layer 23 underlies the pinned layer 24. Alternatively, the pin layer 23 may be disposed between the layers 26, 27, in which case the layer 24 serves as the free layer and the layer 26 serves as the pinned layer. The tunnel barrier layer 25 is formed, for example, of a material such as $Al_2O_3$, NiO, GdO, MgO, $Ta_2O_5$, $MoO_2$, $TiO_2$, $WO_2$, or the like.

The upper metal layer 27 is formed, for example, of a monolayer film or a multilayer film made of simple Ta, Rh, Ru, Os, W, Pd, Pt, or Au, or an alloy made up of two or more of these elements in combination.

In this embodiment, the thickness of the upper metal layer 27 is chosen to be 10 nm or more. It was revealed from the result of an experiment later described (see the section "Examples") that the upper metal layer 27 having the thickness of 10 nm or more reduces a damage to the magneto-resistive layer when an oxide film on the surface of the upper metal layer 27 is removed by dry etching in a manufacturing process to improve the MR ratio. For further reducing the damage to the magneto-resistive layer by an ion beam, the thickness of the metal layer 27 is preferably 12 nm or more, more preferably 13.5 nm or more, further preferably 15 nm or more. However, the upper metal layer 27 having an excessively large thickness is not preferable because it would result in a larger resistance of the upper metal layer 27 and a larger MR gap to cause difficulties in increasing the recording density. Therefore, the thickness of the upper metal layer 27 is preferably 30 nm or less, more preferably 25 nm or less, and further preferably 20 nm or less.

The underlying layer 30 of the upper electrode 31 is an electrically conductive material formed of a non-magnetic metal such as Ta or the like. In this embodiment, the underlying layer 30 is provided for holding a magnetic shield gap (a gap between the electrodes 21, 31) at a desired dimension. However, the underlying layer 30 may not be provided.

As illustrated in FIGS. 3 and 5, hard magnetic layers 28a, 28b are formed on both sides of the free layer 26 and pin layer 23 in the Z-axis direction as bias layers (magnetic domain control layers) for applying a bias magnetic field for magnetic domain control. The hard magnetic layers 28a, 28b are formed, for example, of a material such as Cr/CoPt (cobalt platinum alloy), Cr/CoCrPt (cobalt chromium platinum alloy), TiW/CoPt, TiW/CoCrPt, or the like. An insulating layer 29 made of $Al_2O_3$ or the like is formed on these hard magnetic layers 28a, 28b. The insulating layer 29 is also formed continuously between a region on the pinned layer 24 in which the layers 25, 26, 27 are not formed and the underlying layer 30 of the upper electrode 31, and between a region of the lower metal layer 22 in which the TMR device 2 is not formed and the underlying layer 30 of the upper electrode 31. The insulating layer 29 may be formed, for example, of a material such as $Al_2O_3$, $SiO_2$, MgO, $TiO_2$, or the like.

As illustrated in FIGS. 2 and 3, the inductive magnetic transducing device 3 has the upper electrode 31 which is additionally used as a lower magnetic layer for the device 3; an upper magnetic layer 36; a coil layer 37; a write gap layer 38 made of alumina or the like; an insulating layer 39 made of an organic resin such as a novolac resin, a protection layer 40 made of alumina or the like, and the like. NiFe, FeN or the like, for example, is used as a material for the magnetic layer 36. Leading ends of the upper electrode 31, which is additionally used as the lower magnetic layer, and the upper magnetic layer 36 are formed as a lower pole 31a and an upper pole 36a which oppose each other through the write gap layer 38 made of alumina or the like in an infinitesimal thickness. The lower pole 31a and upper pole 36a write information on a magnetic recording medium. The upper electrode 31, which is additionally used as the lower magnetic layer, and the upper magnetic layer 36 are coupled to each other at a joint 41 at which a yoke is opposite to the lower pole 31a and upper pole 36a so as to complete a magnetic circuit. Within the insulating layer 39, a coil layer 37 is formed such that it is spirally wound around the joint 41 of the yoke. The coil layer 37 has both ends electrically connected to the bonding pads 5c, 5d. The coil layer 37 is arbitrary in the number of turns and the number of layers. Also, the inductive magnetic transducing device 3 may be arbitrary in structure.

Next, description will be made on an exemplary method of manufacturing a magnetic head according to this embodiment.

First, a wafer process is performed. Specifically, a wafer 101 made of $Al_2O_3$-Tic, Sic or the like is provided for making a base 15. Using the thin film forming technology and the like, the aforementioned layers are formed in a large number of magnetic head forming regions in matrix on the wafer 101 to provide the aforementioned structure.

Figure 8A:
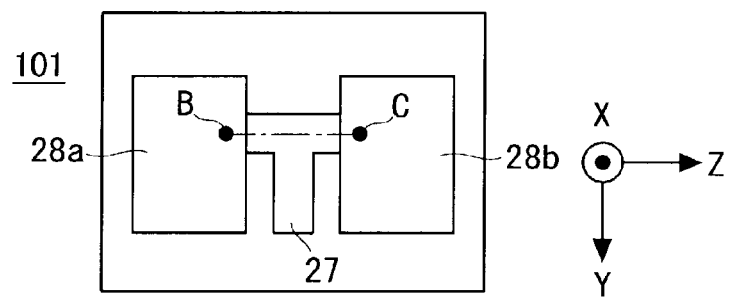
FIGS. 8A and 8B are diagrams schematically illustrating a further step which makes up the wafer process in the method of manufacturing the magnetic head illustrated in FIG. 1.
Figure 8B:
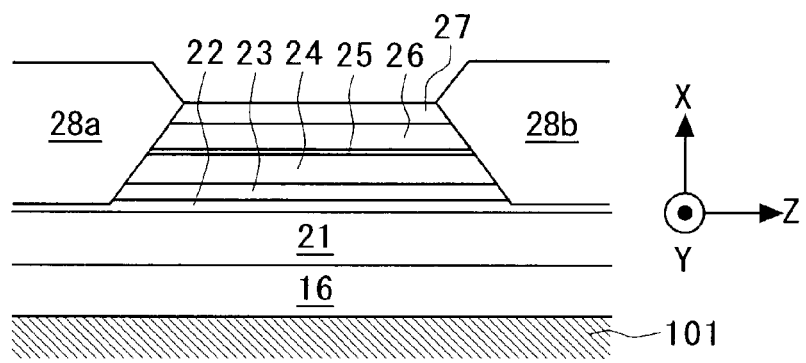
Figure 9A:
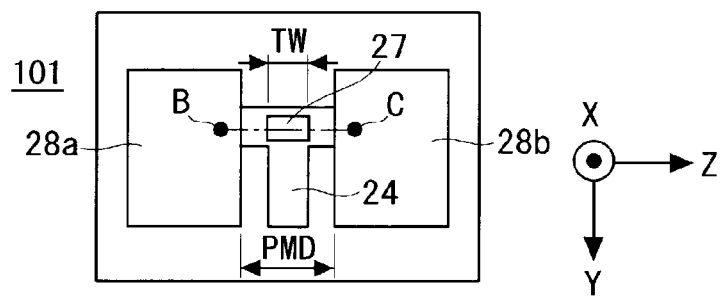
FIGS. 9A and 9B are diagrams schematically illustrating a further step which makes up the wafer process in the method of manufacturing the magnetic head illustrated in FIG. 1.
Figure 9B:
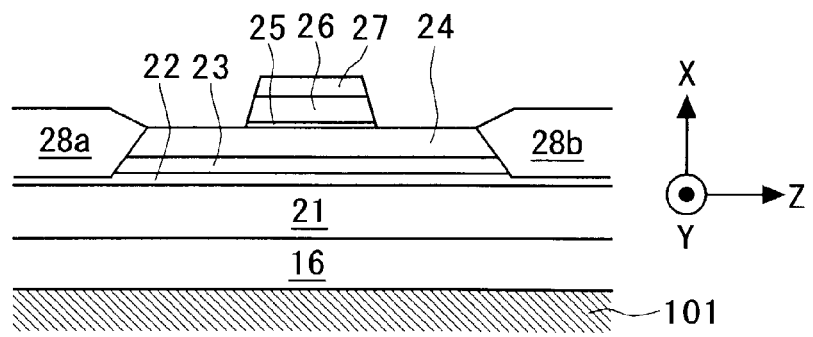
Figure 10A:
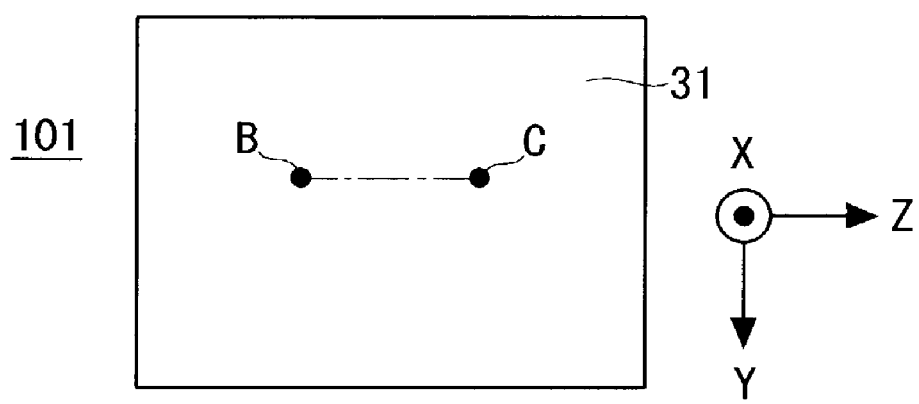
FIGS. 10A and 10B are diagrams schematically illustrating a further step which makes up the wafer process in the method of manufacturing the magnetic head illustrated in FIG. 1.
Figure 10B:
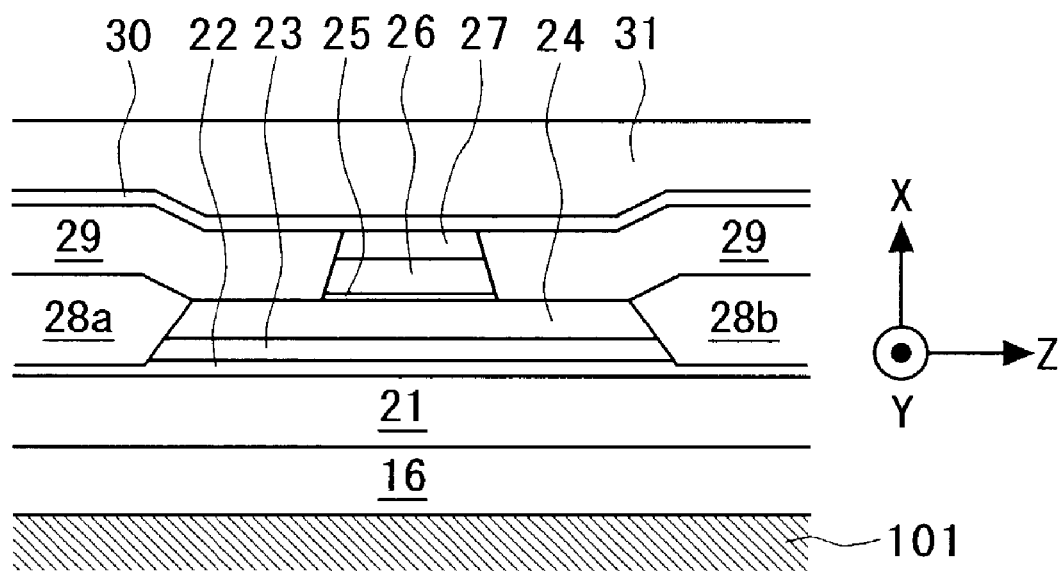

The outline of the wafer process will be described with reference to FIGS. 6 to 10. FIGS. 6 to 10 are diagrams schematically illustrating respective steps which make up the wafer process, wherein FIGS. 6A, 7A, 8A, 9A and 10A are general plan views, respectively; FIG. 6B is a general cross-sectional view taken along a line B–C in FIG. 6A; FIG. 7B is a general cross-sectional view taken along a line B–C in FIG. 7A; FIG. 8B is a general cross-sectional view taken along a line B–C in FIG. 8A; FIG. 9B is a general cross-sectional view taken along a line B–C in FIG. 9A; and FIG. 10B is a general cross-sectional view taken along a line B–C in FIG. 10A. In FIG. 9A, TW indicates the width of a track defined by the TMR device 2, and PMD indicates the distance between the hard magnetic layers 28a, 28b (called the "Permanent Magnet Distance").

Figure 6A:
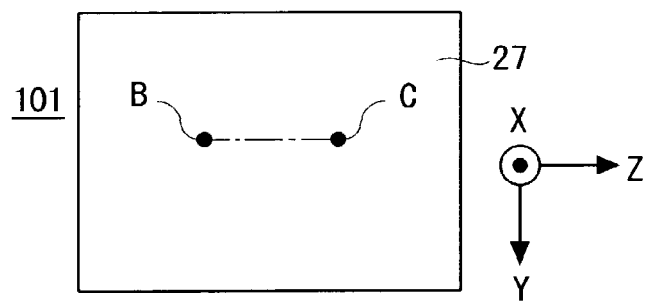
FIGS. 6A and 6B are diagrams schematically illustrating a step which makes up a wafer process in a method of manufacturing the magnetic head illustrated in FIG. 1.
Figure 6B:
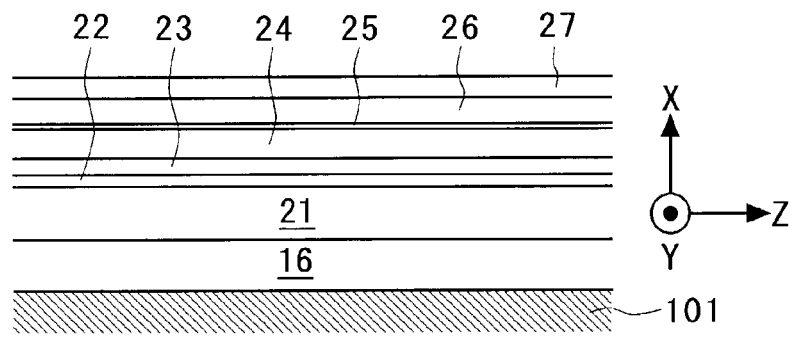

First, in the wafer process, the underlying layer 16, lower electrode 21, lower metal layer 22, pin layer 23, pinned layer 24, tunnel barrier layer 25, free layer 26, and upper metal layer 27 are sequentially laminated on the wafer 101 (FIGS. 6A and 6B). In this event, the lower electrode 21 is formed, for example, by a plating method, while the other layers are formed, for example, by a sputtering method. The upper metal layer 27 is formed in a predetermined thickness such that the thickness of the upper metal layer 27 remains 10 nm or more after dry etching for removing a surface oxide film, later described.

Figure 7A:
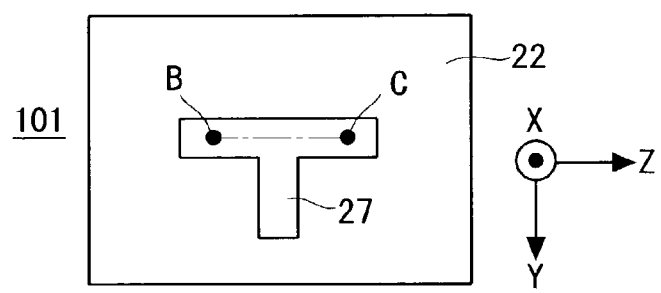
FIGS. 7A and 7B are diagrams schematically illustrating a further step which makes up the wafer process in the method of manufacturing the magnetic head illustrated in FIG. 1.
Figure 7B:
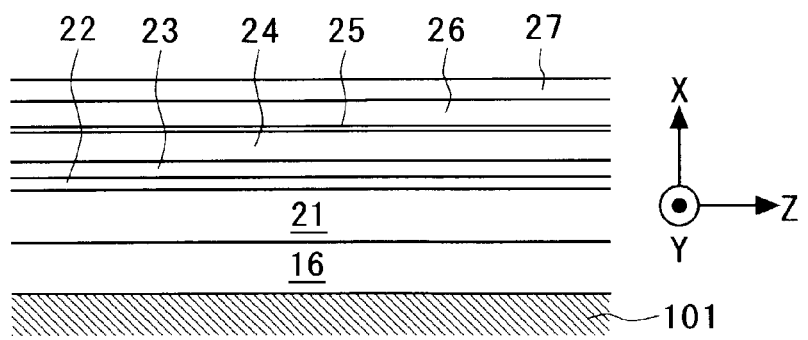

Next, the pin layer 23, pinned layer 24, tunnel barrier layer 25, free layer 26, and upper metal layer 27 are partially removed by ion milling (FIGS. 7A and 7B). Next, the hard magnetic layers 28a, 28b are partially formed (FIGS. 8A and 8B). Subsequently, the tunnel barrier layer 25, free layer 26, and upper metal layer 27 are patterned into a predetermined shape by ion milling (FIGS. 9A and 9B).

Next, the insulating layer 29 is formed by a lift-off method. Subsequently, the substrate 101 is once left in this state in the atmosphere. In this event, the top surface of the magneto-resistive layer (top surface of the free layer 26 in this embodiment) is protected by the upper metal layer 27, so that it is not oxidized. However, an oxide film will be formed on the top surface of the upper metal layer 27. Subsequently, the oxide film formed on the top surface of the upper metal layer 27 is removed by dry etching such as sputter etching, ion beam etching, or the like in the same vacuum chamber in which the underlying layer 30 of the upper electrode 31 is formed. In this event, since the upper metal layer 27 has the thickness of 10 nm or more, the magneto-resistive layer (particularly, the tunnel barrier layer 25) is less damaged by an ion beam. Next, the underlying layer 30 of the upper electrode 31 is formed by a sputtering method or the like, and the upper electrode 31 is formed by a plating method or the like (FIGS. 10A and 10B).

Finally, the gap layer 38, coil layer 37, insulating layer 39, upper magnetic layer 36, and protection layer 40 are formed, and the electrodes 5a–5d are formed. By now, the wafer process is completed.

Next, magnetic heads are completed through a known process for the wafer which has undergone the wafer process. Briefly describing, each bar (bar-shaped magnetic head aggregate) having a plurality of magnetic heads arranged in a line on the base is sawed from the wafer. Next, the bar is lapped on its ABS side for setting a throat height, an MR height, and the like for the bar. Subsequently, the surface of the ABS side of the lapped bar is etched for removing smear as required. Next, the protection film 4 is formed on the surface of the ABS side, and the rails 11, 12 are formed by etching or the like. Finally, the bar is cut by machining into individual magnetic heads. In this manner, the magnetic heads are completed in accordance with the first embodiment.

According to this embodiment, since the upper metal layer 27 is formed on the top surface of the free layer 26 as described above, the upper metal layer 27 prevents the surface of the free layer 26 from oxidization. In addition, even if the surface of the upper metal layer 27 is oxidized in the air, the surface oxide film on the upper metal layer 27 is removed by dry etching before the upper electrode 31 is formed, so that a good electric contact can be established between the upper electrode 31 and upper metal layer 27. In this event, the magneto-resistive layer is damaged by an ion beam in the dry etching. However, in this embodiment, since the upper metal layer 27 has the thickness of 10 nm or more which is larger than the aforementioned thickness in the prior art, the magneto-resistive layer is less damaged than that in the prior art. Thus, the device according to this embodiment exhibits better characteristics such as the MR ratio as compared with the prior art.

As described above, in the foregoing embodiment, in view of the damage to the magneto-resistive layer by an ion beam, which has been so far overlooked, the upper metal layer 27 is made thicker, contrary to the conventional technical common sense that the upper metal layer 27 should be made as thin as possible, to reduce the damage to the magneto-resistive layer by the ion beam and consequently improve the characteristics of the device. While the upper metal layer 27 thicker than before results in a more or less worse end face shape of the free layer 26 and tunnel barrier layer 25 which is determined when these layers 26, 25 are milled, the improvement in the characteristics of the device resulting from the reduction in the damage by the ion beam is more significant than a degradation in the characteristics of the device resulting from the worse end face shape of the free layer 26 and tunnel barrier layer 25, so that the characteristics of the device can be consequently improved from a comprehensive viewpoint.

Next, a head suspension assembly according to a second embodiment of the present invention will be described with reference to FIG. 11.

Figure 11:
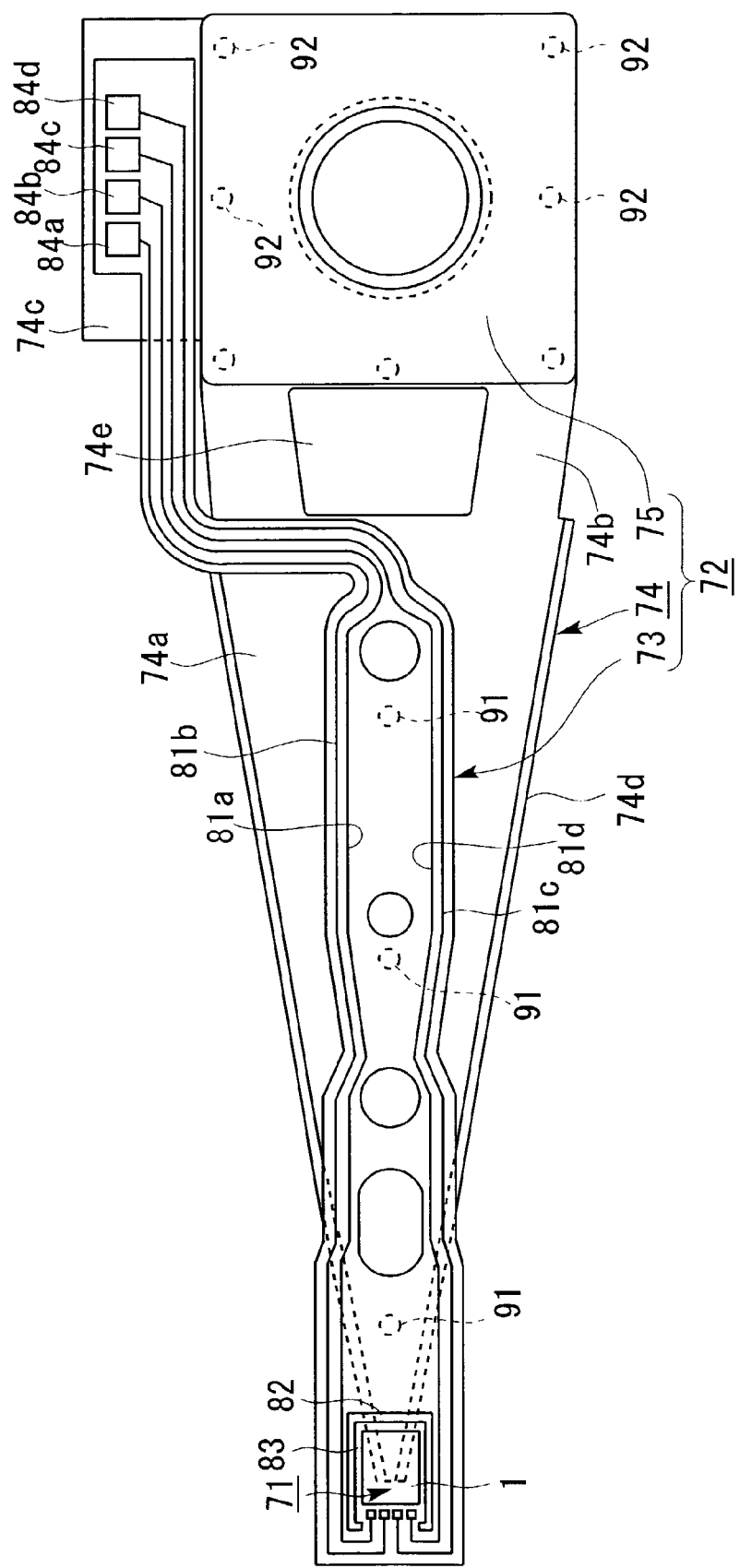
FIG. 11 is a general plan view illustrating a head suspension assembly according to a second embodiment of the present invention.

FIG. 11 is a general plan view illustrating a head suspension assembly according to the second embodiment, when seen from a plane opposite to a magnetic recording medium.

The head suspension assembly according to the second embodiment comprises a magnetic head 71; and a suspension 72 for supporting the magnetic head 71 which is mounted near a leading end thereof. The magnetic heads according to the first embodiment may be used as the magnetic head 71. FIG. 11 only illustrates a slider 1 (see also FIG. 1) as a component of the magnetic head 71.

The suspension 72 comprises a flexure 73 on which the slider 1 of the magnetic head 71 is mounted; a load beam 74 for supporting the flexure 73 and applying a pressing force (load) to the slider 1 of the magnetic head 71; and a base plate 75.

Though not shown, the flexure 73 is comprised of a substrate extending in a strip shape from a leading end to a proximal end thereof and made of a thin stainless steel plate or the like; an insulating layer formed on the substrate and made of a polyimide layer or the like; four conductor patterns 81a–81d formed on the insulating layer for inputting and outputting signals; and a protection layer formed on the conductor patterns and made of a polyimide layer or the like. The conductor patterns 81a–81d extend substantially over the entire length of the flexure 73 along a lengthwise direction thereof.

The flexure 73 is formed at a leading end with a groove 82 substantially in an inverted C-shape, in a plan view, to provide a gimbal 83 to which the slider 1 of the magnetic head 71 is bonded with a bonding agent or the like. The flexure 73 is formed with four bonding pads each electrically connected to one end of a conductor pattern 81a–81d at a location close to a bonding pad 5a–5d (see FIG. 1) formed on the slider 1. These bonding pads are electrically connected to the bonding pads 5a–5d of the slider 1, respectively, with gold balls or the like. The flexure 73 is also formed near a proximal end with bonding pads 84a–84d electrically connected to the other ends of the conductor patterns 81a–81d, respectively, for connection to an external circuit.

The load beam 74 is formed of a relatively thick stainless steel plate or the like. The load beam 74 comprises a rigid portion 74a at a leading end substantially in a triangular shape in a plan view; a base plate joint near the proximal end; a resilient portion 74b positioned between the rigid portion 74a and the joint for generating a pressing force which is applied to the slider 1 of the magnetic head 71; and a supporting portion 74c extending from the joint to one side for supporting the proximal end of the flexure 74. In FIG. 11, a bent-up portion 74d is formed for increasing the rigidity of the rigid portion 74a, and a hole 74e is formed for adjusting the pressing force generated by the resilient portion 74b. The flexure 73 is secured to the rigid portion 74a of the load beam 74 at a plurality of spot welding points 91 by laser welding or the like. Also, a base plate 75 is secured to the joint of the load beam 74 at a plurality of spot welding points 92. A portion of the flexure 73 near the proximal end is supported by a support 74c of the load beam 74 which protrudes from the base plate 75 to one side.

In the second embodiment, the head suspension assembly is mounded with the magnetic head according to the first embodiment as the magnetic head 71, so that when the head suspension assembly according to the second embodiment is used in a magnetic disk drive or the like, the resulting magnetic disk drive can provide a higher recording density.

Next, description will be made on samples fabricated in accordance with Examples 1–3 and Comparative Examples 1, 2.

Wafers (wafers formed with a large number of TMR devices and inductive magnetic transducing devices) after completion of the wafer process in the manufacturing of magnetic heads having similar structure to the magnetic head according to the first embodiment were fabricated as samples of Examples 1, 2, 3 and Comparative Examples 1, 2 in the same method and conditions as one another, corresponding to the aforementioned manufacturing method. The compositions of main layers in these samples are as shown in Table 1 below, and the thickness of the upper metal layer 27 alone was changed as shown in Table 2 below in the samples of Examples 1–3 and Comparative Examples 1, 2. In these samples, the track width TW of the TMR device was chosen to be 0.2 μm.

TABLE 1

| Name of Layer and Reference Numeral in Drawings | Composition and Thickness of Layer (When composed of two layers or more, a layer more to the left is positioned lower (near the substrate) |
|---|---|
| Upper Electrode 31 (serving also as Upper Magnetic Shield) | NiFe (2 μm) |
| Underlying Layer 30 of Upper Electrode | Ta (5 nm) |
| Insulating Layer 29 | Al$_2$O$_3$ (25 nm) |
| Magnetic Layers 28a, 28b | Tiw (10 nm)/CoPt (100 nm)/Ta (5 nm) |
| Upper Metal Layer 27 (cap layer) | Ta (different from one another) |
| Free Layer 26 | CoFe (1 nm)/NiFe (3 nm) |
| Tunnel Barrier Layer 25 | Al$_2$O$_3$ (0.6 nm) |
| Pinned Layer 24 | CoFe (2 nm)/Ru (0.8 nm)/CoFe (3 nm) |
| Pin layer 23 | PtMn (15 nm) |
| Lower Metal Layer 22 | Ta (5 nm)/NiFe (2 nm) |
| Lower Electrode 21 (serving also as Lower Magnetic Shield) | NiFe (2 μm) |

TABLE 2

| Sample | Thickness of Upper Metal Layer 27 (nm) | Resistance (Ω) (Average) | MR Ratio (%) (Average) |
|---|---|---|---|
| Comparative Example 1 | 3 | 61 | 3.77 |
| Comparative Example 2 | 5 | 130 | 7.22 |
| Example 1 | 10 | 213 | 14.42 |
| Example 2 | 15 | 224 | 16.17 |
| Example 3 | 20 | 228 | 16.37 |

During the manufacturing of the samples of Examples 1–3 and Comparative Examples 1, 2, Ar ion beam etching was performed under the following conditions as the dry etching for removing an oxide film on the surface of the upper metal layer 27. An accelerating voltage was set to 250 V; a beam current to 0.1 mA/cm$^2$; an Ar gas pressure to $2\times10^{-4}$ Torr; a substrate temperature to 50° C.; and an etching time to approximately 10 minutes.

Figure 12:
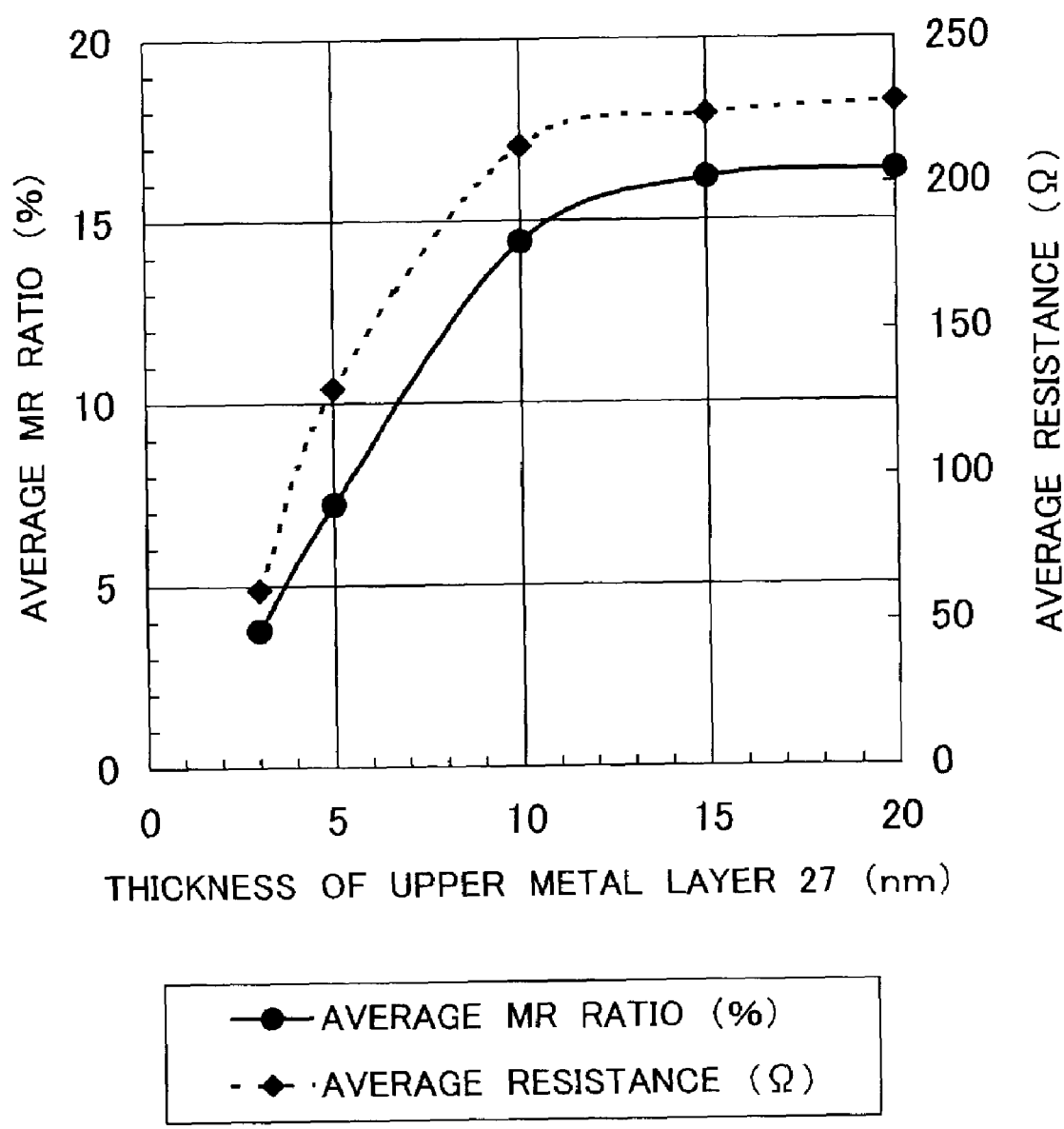
FIG. 12 is a graph representing the result of a measurement shown in Table 2.

The resistance and MR ratio of all TMR devices formed in the wafers were measured for the respective samples of Examples 1–3 and Comparative Examples 1, 2. Table 2 shows the average resistance and average MR ratio of all TMR devices formed in the wafers for the respective samples of Examples 1–3 and Comparative Examples 1, 2 as the result of measurement. FIG. 12 is a graph showing the result of measurement shown in Table 2.

As can be seen from Table 2 and FIG. 12, the upper metal layer 27 having the thickness of 10 nm or more, as in Examples 1–3, results in the MR ratio of approximately 14% or more, thus providing a good MR ratio. Particularly, the upper metal layer 27 having the thickness of 12 nm or more provides the MR ratio of approximately 16% or more; the upper metal layer 27 having the thickness of 13.5 nm or more provides the MR ratio of approximately 16.1% or more; and the upper metal layer 27 having the thickness of 15 nm or more provides the MR ratio of 16.17% or more. Thus, a larger thickness of the upper metal layer 27 results in a higher MR ratio. On the contrary, The upper metal layer 27 having the thickness of 5 nm or less, as is the case with Comparative Examples 1, 2, results in the MR ratio of approximately 7% or less, exhibiting a significant reduction in the MR ratio. Presumably, this is because of the ion beam which penetrates into the tunnel barrier layer during the dry etching for removing the surface oxide layer on the upper metal layer 27 to damage the tunnel barrier layer and form pin-holes therethrough.

While the present invention has been described in connection with the embodiments and examples, the present invention is not limited to them.

For example, TMR film structures may have a pin layer (antiferromagnetic layer) in a lower portion (near a substrate) or in an upper portion (opposite to the substrate) depending on a tunnel barrier layer. The present invention can be applied to either case.

While the foregoing embodiments have shown exemplary magnetic heads which employ a magnetic TMR device in the structure described above, the present invention can be applied as well to magnetic heads which employ TMR devices having other structures, other magneto-resistive devices, and the like. Specifically, the present invention can be applied, for example, to a magnetic head which has a CPP structure other than a TMR head such as a CPP-GMR head.

Further, while the foregoing embodiments have shown examples in which the magneto-resistive device according to the present invention is used in a magnetic head, the magneto-resistive device according to the present invention can be applied as well to a variety of other applications.

As described above, the present invention can provide a magneto-resistive device which is capable of ensuring a good electrical contact between an electrode and a non-magnetic metal layer, while preventing oxidization of the surface of a magneto-resistive layer by using the non-magnetic metal layer, and reducing a damage to the magneto-resistive layer by an ion beam to consequently improve the characteristics of the device, and a magnetic head and a head suspension assembly using the same.

What is claimed is:

1. A magneto-resistive device, comprising:
  a magneto-resistive layer formed on one surface side of a base; and
  a non-magnetic metal layer having one or more layers formed on said magneto-resistive layer on a side opposite to said base, said non-magnetic metal layer having a thickness of 10 nm or more, wherein:
    said magneto-resistive layer includes a tunnel barrier layer; a free layer formed on one surface side of said tunnel barrier layer; a pinned layer formed on other surface side of said tunnel barrier layer; and a pinning layer formed on one surface side of said pinned layer, the one surface being opposite to other surface of said pinned layer facing to said tunnel barrier layer.

2. A magneto-resistive device according to claim 1, wherein said non-magnetic metal layer is formed such that said non-magnetic metal layer substantially exactly overlaps with at least the layer in said magneto-resistive layer furthest away from said base.

3. A magneto-resistive device according to claim 1, further comprising a pair of electrodes for supplying said magneto-resistive layer with a current, wherein at least one of said pair of electrodes is electrically connected to said magneto-resistive layer through said non-magnetic metal layer.

4. A magneto-resistive device according to claim 1, wherein said non-magnetic metal layer includes one or more of materials selected from a group consisting of tantalum, rhodium, ruthenium, osmium, tungsten, palladium, platinum, gold, and alloys including one or more of the materials.

5. A magneto-resistive device according to claim 1, wherein the thickness of said non-magnetic metal layer is 12 nm or more.

6. A magneto-resistive device according to claim 1, wherein the thickness of said non-magnetic metal layer is 20 nm or more.

7. A magneto-resistive device according to claim 1, wherein said non-magnetic metal layer has been dry etched by ion beam irradiation.

8. A magneto-resistive device according to claim 7, wherein the dry etching by ion beam irradiation is ion beam etching or sputter etching.

9. A magnetic head comprising:
   a base; and
   a magneto-resistive device supported by said base, said magneto-resistive device including:
   a magneto-resistive layer formed on one surface side of said base; and
   a non-magnetic metal layer having one or more layers formed on said magneto-resistive layer on a side opposite to said base, said non-magnetic metal layer having a thickness of 10 nm or more, wherein:
      said magneto-resistive layer includes a tunnel barrier layer; a free layer formed on one surface side of said tunnel barrier layer; a pinned layer formed on other surface side of said tunnel barrier layer; and a pinning layer formed on one surface side of said pinned layer, the one surface being opposite to other surface of said pinned layer facing to said tunnel barrier layer.

10. A magnetic head according to claim 9, wherein the thickness of said non-magnetic metal layer is 12 nm or more.

11. A magnetic head according to claim 9, wherein the thickness of said non-magnetic metal layer is 20 nm or more.

12. A magnetic head according to claim 9, wherein said non-magnetic metal layer has been dry etched by ion beam irradiation.

13. A magnetic head according to claim 12, wherein the dry etching by ion beam irradiation is ion beam etching or sputter etching.

14. A head suspension assembly having a magnetic head, and a suspension for supporting said magnetic head mounted near a leading end thereof, said magnetic head including a base, and a magneto-resistive device supported by said base, said magneto-resistive device comprising:
   a magneto-resistive layer formed on one surface side of said base; and
   a non-magnetic metal layer having one or more layers formed on said magneto-resistive layer on a side opposite to said base, said non-magnetic metal layer having a thickness of 10 nm or more, wherein:
      said magneto-resistive layer includes a tunnel barrier layer; a free layer formed on one surface side of said tunnel barrier layer; a pinned layer formed on other surface side of said tunnel barrier layer; and a pinning layer formed on one surface side of said pinned layer, the one surface being opposite to other surface of said pinned layer facing to said tunnel barrier layer.

15. A head suspension assembly according to claim 14, wherein the thickness of said non-magnetic metal layer is 12 nm or more.

16. A head suspension assembly according to claim 14, wherein the thickness of said non-magnetic metal layer is 20 nm or more.

17. A head suspension assembly according to claim 14, wherein said non-magnetic metal layer has been dry etched by ion beam irradiation.

18. A head suspension assembly according to claim 17, wherein the dry etching by ion beam irradiation is ion beam etching or sputter etching.

* * * * *